United States Patent

Burchanowski et al.

[11] Patent Number: 5,986,281
[45] Date of Patent: Nov. 16, 1999

[54] CIRCUIT AND METHOD FOR PREDICTING FAILURE RATES IN A SEMICONDUCTOR DEVICE

[75] Inventors: William Edward Burchanowski, Bethlehem; Jeffrey Alan Reed, Hellertown; Ramin Khoini-Poorfard, Allentown, all of Pa.

[73] Assignee: Lucent Technologies, Inc., Murray Hill, N.J.

[21] Appl. No.: 08/956,409

[22] Filed: Oct. 23, 1997

[51] Int. Cl.⁶ .................................................. H01L 23/58
[52] U.S. Cl. ................................................ 257/48; 324/765
[58] Field of Search .................................. 324/765, 768; 257/48; 438/17–18

[56] References Cited

U.S. PATENT DOCUMENTS

| | | | |
|---|---|---|---|
| 4,325,025 | 4/1982 | Corcoran et al. | 324/158 R |
| 4,520,448 | 5/1985 | Tremintin | 364/488 |
| 4,801,869 | 1/1989 | Sprogis | 324/73 R |
| 5,394,101 | 2/1995 | Mitros | 324/769 |
| 5,498,974 | 3/1996 | Verkuil et al. | 324/767 |
| 5,619,459 | 4/1997 | Gilliam | 365/201 |
| 5,751,015 | 5/1998 | Corbett et al. | 257/48 |
| 5,773,989 | 6/1998 | Edelman et al. | 324/765 |

OTHER PUBLICATIONS

G. Barbottin and A. Vapaille (eds.) Instabilities in Silicon Devices: Silicon Passivation and Related Instabilities, 1986, vol. 1, Chapter 8, pp. 403–439.

*Primary Examiner*—John Guay
*Attorney, Agent, or Firm*—Locke Liddell & Sapp LLP

[57] ABSTRACT

A circuit and method for detecting mobile ion contamination in a semiconductor device. The circuit uses two transistor structures on the same silicon chip as the circuit being tested to detect the presence (or absence) of mobile ions. The test includes imposing conditions on the silicon chip that may cause any mobile ions present therein to move within the structure. By measuring electrical parameters, such as a band gap voltage, across the transistors before and after the imposition of such conditions, a reliable indication of the presence or absence of mobile ions can be obtained.

9 Claims, 1 Drawing Sheet

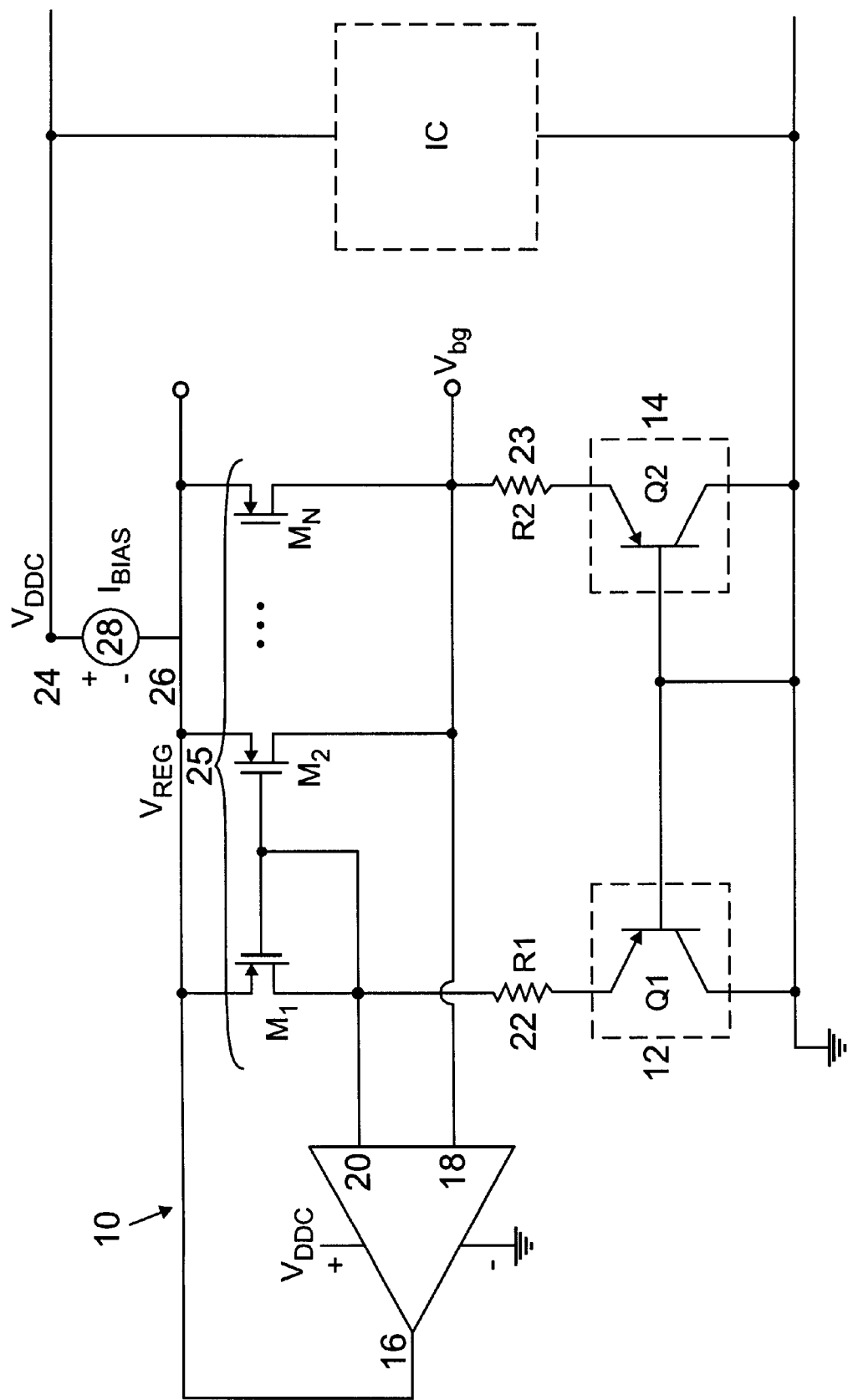

CIRCUIT AND METHOD FOR PREDICTING FAILURE RATES IN A SEMICONDUCTOR DEVICE

BACKGROUND OF THE INVENTION

1. Field of the Invention

This invention relates generally to electronic devices and more specifically to a method and device for helping to predict failure rates in semiconductor devices. It is believed that mobile ion contamination is the phenomena which is being detected, but regardless of the reasons for failure, the method, devices, and circuitry described below can be used to help predict rates of failure of an integrated circuit device.

2. Description of Related Art

Positive ion contamination in semiconductor circuits located in the $SiO_2$ and at the $Si-SiO_2$ interface can cause instabilities in the operation of the devices and produce spurious results. Most commonly, the mobile ions that cause these problems are $Na^+$ or $P^+$. Several known methods exist to help detect this contamination, such as Bias-Temperature Capacitance-Voltage (BTCV), Bias-Temperature Current-Voltage (BT-IV), Triangular Voltage Sweep (TVS) and Thermally Stimulated Ionic Conductivity (TSIC).

On-chip testing circuits have been proposed to detect ion contamination. In particular, U.S. Pat. No. 5,394,101 issued to Mitros describes a method for detecting mobile ions through the use of a transistor with a floating gate. The transistor is, first biased to cause charge accumulation on the floating gate. The current through the transistor that corresponds to the accumulated charge is then measured. After the movement of mobile ions to the floating gate has been accelerated through a bake of the device, the current through the transistor (which now corresponds to the remaining charge on the floating gate) is measured. The difference between the two current values indicates the charge accumulation on the gate neutralized by the mobile ions. This approach, however, has the disadvantage of requiring an extra floating gate which increases the cost of the fabrication process due to added processing steps.

U.S. Pat. No. 5,619,459 issued to Gilliam describes another on-chip test circuit for detecting ion contamination. The circuit includes an enabling circuit, a voltage pump, and a regulating circuit. The test circuit is able to operate in two modes: normal and test. When in normal mode, the voltage of the substrate is held at an operating level via a voltage pump which becomes active whenever the substrate voltage drops below the operating voltage level. In the test mode, the voltage pump drives the substrate voltage toward the operating voltage while the regulating circuit shunts enough current to ground to hold the substrate at a different voltage between ground and the operating voltage, thereby allowing testing of the chip for mobile ion contamination without having to ground the substrate. Unfortunately, it is this voltage pump circuitry which causes problems for low voltage circuits (i.e., below three volts). Because the voltage pump reverse-biases the substrate, it may blow the gate of the circuit due to the fairly low voltage tolerance of the oxide gate in MOS circuits.

The method, devices and circuitry of the present invention provide additional reliable means by which ion contamination may be detected with the following advantages.

SUMMARY OF THE INVENTION

An advantage of the invention is early prediction of failure rates for integrated circuit devices.

Another advantage of the invention is the detection of mobile ion contamination contained in the oxide layers of an integrated circuit.

A further advantage of the present invention is the improvement of process feedback to the clean room by diagnosing mobile ion contamination at an earlier stage of manufacture.

Still another advantage of the invention is the testing circuit's increased sensitivity to mobile ions enabling their detection at a level lower than that previously possible with loose functional testing.

The present invention relates to a device for predicting the rate of failure of ICs, and the basic test circuit comprises two band gap transistors located on the same substrate as the IC being tested. The device detects the existence of mobile ions located in the substrate of the IC which may interfere with proper operation of the IC by measuring a difference in reference voltage across the band gap transistors. The preferred embodiment of the test circuit includes a voltage supply; a current supply; an operational amplifier; a plurality of supply transistors connected between the voltage supply and the operational amplifier; two band gap transistors each having a base, emitter and collector; and at least two resistors all connected in a standard band gap configuration. In addition, a method for predicting the failure rate of an IC device is disclosed. The method includes the steps of forming at least two band gap transistors on the same substrate as the IC device; measuring an electrical parameter of the two band gap transistors; subjecting the substrate to mobile ion moving conditions; measuring the same electrical parameter of the two band gap transistors; and comparing the two measurements.

BRIEF DESCRIPTION OF THE DRAWING

The figure is a schematic of the test circuit shown in relation to the integrated circuit being tested.

DETAILED DESCRIPTION OF THE PREFERRED EMBODIMENT

The present invention uses standard band gap circuitry, namely two transistor structures, on the silicon chip or wafer (hereinafter referred to as "band gap transistors") to test for the presence (or absence) of mobile ions. The test includes imposing conditions on the silicon chip or wafer that may cause any mobile ions present therein to move within the structure. By measuring electrical parameters of the band gap circuit before and after the imposition of such conditions, it has been discovered that a reliable indication of the presence or absence of mobile ions can be obtained. More specifically, if there is virtually no change in electrical parameters before and after imposition of the ion moving conditions, then the amount of mobile ions present is low or nonexistent. If, on the other hand, a change in the electrical parameters of the band gap circuit occurs, then the presence of mobile ions in the silicon structure is indicated. When using band gap transistors to implement the band gap circuit, the exact reasons why the different input current densities (for symmetrical band gap transistors) or the geometric asymmetry (for asymmetric band gap transistors) causes variation in electrical readings taken before and after ion moving conditions (such as a so-called "burn-in") are imposed on the chip or wafer are not known. It is theorized that a larger number of ions may collect on the transistor having the larger base-to-emitter voltage, causing differences in charge, which can then be sensed by suitable test circuitry.

Thus, the present invention includes forming at least two band gap transistors on the same substrate of an IC such that the current densities through the two transistors are different, thereby creating a different band gap voltage across each. The differing current densities may be accomplished by either using identical band gap transistors and supplying them with different current densities, or by using band gap transistors having different physical sizes. A preferred size difference, for example, is where the emitter area of one band gap transistor is approximately eight times the area of the emitter structure of the other. Generally differences in size of emitter areas from about 2:1 to about 48:1 are thought to be preferred. Test circuitry is then used to determine baseline electrical characteristics of the band gap transistors. The substrate is then subjected to conditions that are known to cause mobile ions to move if they are present. For example, the IC can be brought up to operating voltage and the substrate subjected to oven heat. Typical conditions can be 100° C. to 150° C. for a period of five to 24 hours. After the ion moving condition has been applied for some period of time, the electrical parameters of the band gap transistors are measured a second time. A comparison of the parameters before and after the application of the ion moving conditions will be predictive of the failure rate of the ICs on the substrate. In general, changes in the parameters indicate that the failure rate will be higher, while if the parameters remain substantially unchanged, the rate of failure will be lower.

The preferred test circuit making up the present invention is placed on the same substrate as the IC being tested. The circuit can consist of two band gap transistors, an operational amplifier, a supply voltage, a regulated voltage, a current source, several supply transistors and at least two resistors. The band gap transistors are configured in a standard band gap circuit configuration so as to measure a reference voltage (referred to as the band gap voltage) across the test circuit. An initial measurement of the band gap voltage electrical parameter is made. Then the circuit is subjected to a mobile ion moving condition such as a typical burn-in process which accelerates the flow of mobile ion contaminants, if any, in the substrate. After burn-in, the reference current and voltage are applied, and the band gap voltage electrical parameter across the band gap transistors is measured again. Alternatively, the electrical parameter may be monitored continuously throughout the testing process. Because the current densities through the two band gap test circuit transistors is different, this mismatch between the transistors produces an indication of ion contamination via a difference in the measured band gap voltages before and after burn-in. The supply transistors used in the test circuit help to initialize the test circuit and to regulate the current densities through the band gap transistors.

The method of the present invention can use the previously described band gap circuit in the same fashion as described above. The test circuit is included on the silicon substrate with the IC to be tested. One such test circuit is put in each gridline of the wafer. When the biasing voltage and current are applied to the IC, the band gap voltage at the test circuit is measured. The entire IC then undergoes a standard mobile ion moving condition, such as a burn-in process. After burn-in, the same biasing voltage and current are applied to the IC, and the band gap voltage at the test circuit is measured again. A change in the measured test circuit band gap voltages before and after burn-in indicates that the IC is contaminated with mobile ions and will likely fail.

With reference to the figure, a preferred embodiment of the test circuit 10 of the present invention is shown in connection with an integrated circuit (IC) to be tested for an indication of rate of failure, possibly due to mobile ion contamination. The figure shows a general band gap core test circuit 10. When CMOS technology is used, only substrate PNP transistors are allowed in the preferred embodiment. If BiCMOS technology is used, however, the extra fabrication steps may be used to create NPN transistors. The band gap test circuit 10 of the present invention is placed on the same substrate as the IC being tested.

The test circuit 10 consists of two band gap transistors Q1 12 and Q2 14, both of which are bipolar junction transistors.

Q1 12 and Q2 14 may either be identical, or asymmetrical in that their physical characteristics may be mismatched. The test circuit 10 accomplishes the function of mobile ion detection when different current densities are supplied to the band gap transistors Q1 12 and Q2 14 and the corresponding base-to-emitter voltage is measured before and after the test circuit 10 has been subjected to a mobile ion moving condition. The different current densities may be achieved through the use of identical band gap transistors having a ratio of 1:1 in conjunction with appropriate supply transistors M1 through MN 25 divided up to provide different current densities to Q1 12 and Q2 14. Alternatively, as described for the preferred embodiment, Q1 12 and Q2 14 may be asymmetrical transistors due to differences in the size of their effective emitter areas. When physical differences in the transistors 12 and 14 are utilized, the desired current densities may be achieved with fewer supply transistors 25.

In the preferred embodiment, the goal was to supply Q1 12 and Q2 14 with current densities having a ratio of 48:1. This ratio was selected because it produced a difference in the baseto-emitter voltages measured before and after the ion moving condition of approximately 100 millivolts. However, the test circuit 10 could be designed to produce a base-to-emitter voltage difference in an alternative range. This would result in circuit design changes including correspondingly different current densities, a different number of supply transistors 25 and a different ratio of effective physical characteristics between transistors 12 and 14. To achieve the 48:1 current densities in the preferred embodiment, Q1 12 has an emitter with an effective area which is eight times that of Q2. In practice, this effect is accomplished by arranging nine bipolar junction transistors in a 3×3 array. The transistor Q1 12 is placed in the center of the array while the transistor Q2 14 is created by placing eight other transistors which are identical to Q1 12 in the eight remaining positions of the array. The eight outside transistors are then linked to each other to create a single transistor, i.e., Q2 14, having an effective emitter area eight times that of Q1 12.

The bases and collectors of Q1 12 and Q2 14 are connected to ground. The emitter of Q1 12 is connected to one input 20 of an op amp 16 through resistor R1 22, while the emitter of Q2 14 is connected to the other input 18 of the op amp 16 through resistor R2 23. The output of the op amp 16 is connected directly to node $V_{REG}$ 26. A series of supply transistors M1 through MN 25 are connected between $V_{REG}$ 26 and the collectors of Q1 12 and Q2 14. In the preferred embodiment, six supply transistors 25 are used to provide current to the band gap circuit 10 because their use in combination with the 8:1 ratio of emitter areas for Q1 12 and Q2 14 produces the desired 48:1 ratio of current densities through the band gap transistors 12 and 14. As previously pointed out, any number of supply transistors 25 from a single one up to 48 could be used for this particular embodiment.

The design of the test circuit 10 also makes use of the op amp 16 to regulate $V_{REG}$ 26 through negative feedback. The IC is connected between ground and the voltage supply $V_{DDC}$ 24. Between $V_{DDC}$ 24 and $V_{REG}$ 26, a current source $I_{BIAS}$ 28 is needed to provide current through the supply transistors 25 to the test circuit 10 and IC upon initialization and during operation of the circuit 10. In the design of the preferred embodiment, the current and voltage values used were $V_{DDC}$: 3.0±10%, $I_{BIAS}$: approximately 130 microamps, giving a $V_{REG}$ of approximately 2 volts.

The band gap transistors 12 and 14 are configured in a standard band gap circuit configuration so as to measure a reference voltage (referred to as the band gap voltage) across the test circuit 10 taken between the emitter and base of one either of the transistors 12 and 14. The band gap voltage is first measured before the IC undergoes a mobile ion moving condition, such as burn-in. In the preferred embodiment, the band gap voltage measured about 1.24 volts. After burn-in, the band gap voltage is measured again and compared to the initial band gap voltage measurement. The difference in the geometry of the two asymmetrical transistors Q1 12 and Q2 14 of the preferred embodiment provides the indication of ion contamination via a difference in the two measured band gap voltages. A voltage difference as low as one millivolt indicates ion contamination of the IC. Such differences in voltage are predictive of a higher rate of failure for the ICs on the substrate.

METHOD OF OPERATION

The method of the present invention uses the previously described band gap test circuit 10. The test circuit 10 is positioned on the silicon substrate with the IC. One such test circuit is put in each gridline of the wafer. Before the test circuit is subjected to a mobile ion moving condition, a biasing voltage is applied to the IC and the band gap voltage at the test circuit is measured. Next, the entire wafer including the test circuit is subjected to a process which will cause any mobile ions contaminating the substrate to move within the substrate.

In the preferred embodiment, the process is typically a burn-in which involves the following steps: application of the operating-level voltages for the IC to the circuit, and subjecting the IC to increased temperature for a minimum amount of time. In the preferred embodiment, the mobile ion moving process consisted of a bake of the circuit at 150° C. for a 24 hour period. After the mobile ion moving process is completed, the same biasing voltage is again applied to the IC and a second band gap voltage is measured at the test circuit. The two band gap voltages, measured before and after the mobile ion moving process, are then compared to produce a possible offset voltage. Alternatively, the band gap voltage may be continuously monitored throughout the process and compared to the initial bad gap voltage taken before the mobile ion moving process occurred. However, it must be pointed out that, especially when measuring band gap voltages in the five millivolt range or less, the conditions surrounding the measurement of the voltages must be identical before an accurate comparison of the two band gap voltages may be made. Such conditions include, but are not limited to, 1) use of the same voltmeter to make the measurements (to ensure that the same input impedance is used for both measurements) and 2) measurement of the band gap voltages at the same substrate temperature since even a small temperature difference can affect the measurement of the band gap voltage. The closer are the conditions under which the voltage measurements are made, the more accurate the offset voltage calculation, and the resulting determination regarding ion contamination, will be. Thus, an offset voltage sensed by the test circuit 10 in the measured band gap voltages before and after the ion mobility process indicates that the IC may be contaminated with mobile ions, and is therefore subject to higher failure rates. Typical values for the offset voltage are in the range of 10 mV to 50 mV although the test circuit can detect offset voltages as low as 1 mV±1 mV which may indicate mobile ion contamination.

It is intended that the above description of the preferred embodiment of the structure of the present invention is but one enabling best mode embodiment for implementing the invention. Variations in the above description likely to be conceived of by those skilled in the art still fall within the breadth and scope of the disclosure of the present invention. While specific alternatives to components of the invention have been described herein, additional alternatives not specifically disclosed but known in the art are intended to fall within the scope of the invention. The primary import of the present invention lies in its ease of incorporation into the IC fabrication process and its ability to detect lower levels of ion contamination than those detectable by loose functional testing. Again, it is understood that other applications of the present invention will be apparent to those skilled in the art upon the reading of the preferred embodiments and a consideration of the appended claims and drawing.

We claim:

1. A method for predicting the failure rate of an IC device comprising:

forming at least two band gap transistors on the same substrate as the IC device;

measuring an electrical parameter of the two band gap transistors;

subjecting the substrate to mobile ion moving conditions;

measuring the same electrical parameter of the two band gap transistors; and comparing the two measurements.

2. The method of claim 1 wherein said band gap transistors are asymmetric due to a difference in effective emitter area by a ratio of from 1:1 to about 48:1.

3. The method of claim 2 where the asymmetry is effected by one transistor having an effective emitter area about eight times as large as the other.

4. The method of claim 1 wherein said band gap transistors are asymmetric due to a difference size between the gate portions of the two band gap transistors.

5. The method of claim 1 wherein the electrical parameter measured is voltage.

6. The method of claim 1 wherein the mobile ion moving conditions comprise a burn-in process.

7. A method for detecting mobile ion contamination of an integrated circuit using a test circuit located on the same substrate, comprising the steps of:

applying a biasing voltage to the test circuit and integrated circuit;

measuring a first band gap voltage at the test circuit;

subjecting the test circuit and integrated circuit to a burn-in process;

applying the same biasing voltage to the test circuit and integrated circuit as was previously applied;

measuring a second band gap voltage at the test circuit after burn-in; and determining the difference, if any, between the first band gap voltage and the second band gap voltage.

8. The method of claim 7 wherein the subjecting step comprises:

applying operating-level voltages to the test circuit and integrated circuit;

subjecting the test circuit and integrated circuit to increased temperature for at least a minimum amount of time; and permitting the entire circuit to cool to room temperature.

9. The method of claim 8 wherein the increased temperature is between 100° C. and 150° C. and the minimum amount of time is about five hours.

* * * * *